(12) United States Patent  
Johansson et al.

(10) Patent No.: US 6,953,981 B1
(45) Date of Patent: Oct. 11, 2005

(54) SEMICONDUCTOR DEVICE WITH DEEP SUBSTRATES CONTACTS

(75) Inventors: Ted Johansson, Djursholm (SE); Arne Rydin, Fjardhundra (SE); Christian Nyström, Sollentuna (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/500,994

(22) Filed: Feb. 9, 2000

(30) Foreign Application Priority Data

Feb. 10, 1999 (SE) ............................................. 9900446

(51) Int. Cl.[7] ......................... H01L 29/00; H01L 27/82; H01L 27/102; H01L 29/70; H01L 31/11; H01L 23/52; H01L 23/04; H01L 23/34

(52) U.S. Cl. ..................... 257/503; 257/526; 257/546; 257/549; 257/552; 257/565; 257/584; 257/691; 257/698; 257/728; 257/725

(58) Field of Search ................................ 257/509, 510, 257/526, 524, 528, 544, 546, 548, 549, 552, 553, 554, 563, 564, 565, 573, 577, 578, 584, 666, 691, 697, 698, 693, 784, 203, 207, 208, 728, 724, 725, 341, 500

(56) References Cited

U.S. PATENT DOCUMENTS 5,202,752 A     4/1993   Honjo
5,240,867 A * 8/1993 Suzuki et al. ............... 438/430
5,583,367 A * 12/1996 Blossfeld ..................... 257/426
5,821,144 A    10/1998 D'Anna et al.
6,063,678 A * 5/2000 D'Anna ....................... 438/301

FOREIGN PATENT DOCUMENTS

GB      2 046 514 A    11/1980
WO    WO 97/35344     9/1997

* cited by examiner

Primary Examiner—Nathan J. Flynn
Assistant Examiner—Victor A. Mandala, Jr.
(74) Attorney, Agent, or Firm—Burns, Doane, Swecker & Mathis, LLP

(57) ABSTRACT

The present invention relates to a semiconductor device arranged at a surface of a semiconductor substrate having an initial doping having an electrical connection comprising at least one plug made of a material with a high conductivity, especially a material other than the substrate, especially a metal plug, between said initially doped substrate and said surface of the substrate. The device has at least one ground connection arranged to be connected to a ground pin on a package. The ground connection is arranged to be connected to said ground pin using said electrical connection, where the initially doped substrate is arranged to be connected to said ground pin via a reverse side of the substrate, opposite said surface, and thereby being arranged to establish a connection between said ground connection and said ground pin.

12 Claims, 4 Drawing Sheets

SEMICONDUCTOR DEVICE WITH DEEP SUBSTRATES CONTACTS

This application claims priority under 35 U.S.C. §§119 and/or 365 to 9900446-7 filed in Sweden on Feb. 10, 1999; the entire content of which is hereby incorporated by reference.

TECHNICAL FIELD OF THE INVENTION

The present invention relates to a semiconductor device and to a semiconductor integrated circuit mounted in a package comprising a semiconductor circuit with at least one semiconductor device.

DESCRIPTION OF RELATED ART

An operating frequency for modern telecommunication electronics range from several hundred megahertz up into the gigahertz region. Power transistors operate most efficiently at large signal levels and high current densities. Present high-voltage silicon RF power transistors can deliver several hundreds of Watts of output power at frequencies greater than 2 GHz and are operated at typically 25 V. These transistors are typically used in stationary applications, like output amplifiers in cellular base stations, digital broadcasting, or television transmitters.

For applications like wireless handy phones, the supply voltage is limited to 2–6 V range (battery operation), the output power is in the 0.1–4 W range and the operating frequency is in the 1–3 GHz range.

The dominating type of technology in this field is GaAs-based, but silicon-based circuits are now being developed in this area. Silicon's main advantage is the considerably lower price, and its disadvantage the more limited performance at high frequencies.

A common difficulty for all RF power applications is to maintain the power gain and output power when the operating frequency is increased and the supply voltage is decreased. Especially a parasitic emitter/source inductance from bonding wires is deleterious for this performance, because it constitutes a critical part of transferring power to a load. This will ultimately lead to a limitation in the size of the devices and the usefulness of the devices for a certain application. This applies as well for integrated amplifiers with lower voltage and lower power as for discrete high voltage RF power transistors, in bipolar and MOS technologies. A low impedance connection to ground is essential for these types of devices.

An integrated circuit, comprising a plurality of semiconductor devices, manufactured on a semiconductor substrate, is normally placed in a package with pins or other means to contact the integrated circuit. The pins are normally connected to the integrated circuit via bonding wires, which can have different length. A ground pin may be connected to a lead-frame, so called fused lead-frame, on which the integrated circuit is mounted, where the reverse side of the substrate is in electrical contact with the lead-frame.

A normal connection from bond pads on the integrated circuit to the pins is obtained via long bonding wires, having approximately 1 nH/mm in inductance and approximately 3 mΩ/mm in resistance at DC for a bonding wire with a diameter of 10–30 $\mu$m (1–2 mils). Parallel bonding wires are used to minimise the inductance and the resistance.

A typical length of a bond wire in a package is 1–2 mm, which gives an inductance of 1–2 nH/bond wire. By introducing short bonding wires from bond pads down to the lead-frame for the ground connection, the inductance may be reduced down to 0.2 nH, which creates an impedance of approx. 2.5 Ohms at 2 GHz.

Existing techniques used to create low impedance contacts between the source and the substrate in a Lateral DMOS transistor comprises high doped diffused plugs or contact structures including a trench filled with a conductor as is described in U.S. Pat. No. 5,821,144 by D'Anna et al.

Other types of contacts creating a low impedance contact have etched holes through the substrate, which are filled with metal, for GaAs MESFET applications.

Deep tungsten filled substrate contacts for semiconductor devices with high frequency applications are described in the patent application WO 97/35344, by Norstrom et al. The contacts provide a direct coupling means between a first metal layer and a highly doped substrate through a low doped epitaxial layer, in which said devices are implemented. The patent application comprises a method and a device for use as an earth plane, interference and cross-talk reduction and screening.

SUMMARY OF THE INVENTION

An object of the present invention is to provide a semiconductor device having a ground connection, where said ground connection is arranged to be connected to a ground pin on a package via a low impedance connection, especially at high frequencies.

Another object of the present invention is to provide an integrated circuit, comprising a semiconductor circuit with at least one semiconductor device, mounted in a package, having a low impedance connection between a ground connection of said devices and a ground pin on said package.

These objects are achieved by a semiconductor device, which is arranged at a surface of a semiconductor substrate, having an initial doping, said device comprising an electrical connection, comprising at least one plug made of a material with a high conductivity, between said initially doped substrate and said surface of the substrate, and said device having at least one ground connection arranged to be connected to a ground pin on a package, said at least one ground connection is arranged to be connected to said ground pin using said electrical connection, where said substrate is arranged to be connected to said ground pin via a reverse side of the substrate, opposite said surface, and thereby being arranged to establish a connection between said ground connection and said ground pin.

An advantage with the present invention is that a contact with low impedance may be established between a ground connection of a device and a ground pin on a package, especially for high frequency application.

Another advantage is that less bonding pads are needed on the surface of the semiconductor substrate for connecting a semiconductor device since the ground connection is connected via the reverse side of the substrate.

A further advantage is that bonding wires for a circuit, according to the present invention, is faster to connect in a package, since less bonding pads are needed.

Yet another advantage of the present invention is that a large amount of current may be directed through the ground connection by having a plurality of plugs for each ground connection.

Still another advantage is that any type of device with a ground connection easily may be connected through at least one plug without having to establish a conductive pattern to a bonding pad on an integrated circuit having at least one semiconductor device according to the invention.

The present invention will now be described with reference to the accompanying drawings.

DETAILED DESCRIPTION OF PREFERRED EMBODIMENTS

Figure 1:
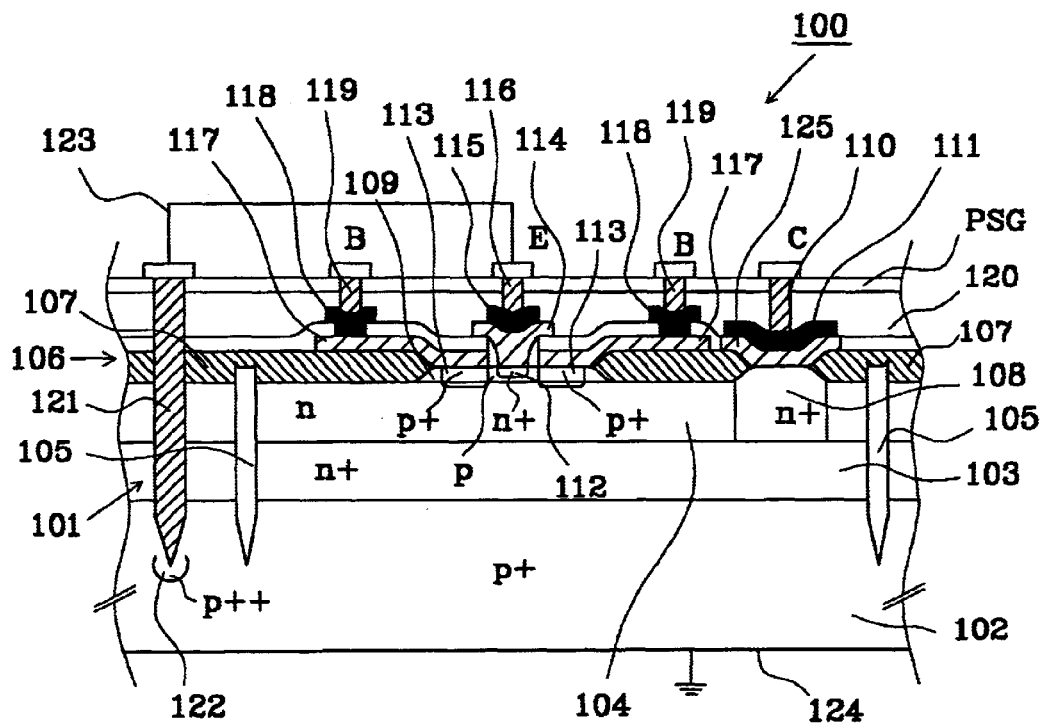
FIG. 1 shows a partial cross section of a semiconductor circuit, comprising a double polysilicon self-aligned bipolar transistor with a ground connection according to the present invention.

FIG. 1 shows a partial cross section semiconductor circuit, comprising at least one double polysilicon self-aligned bipolar transistor 100 with an electrical connection 101 according to the present invention.

The semiconductor device 100, in this example a bipolar NPN transistor, is manufactured on a substrate 102, having an initial high doping of a first type p+, on which a first epitaxial layer is grown to form a buried layer 103, having a high doping of a second type n+ opposite said first type p+. A second epitaxial layer is grown on top of the buried layer 103 to form a n-well 104, where the second epitaxial layer has a doping of the second type n. The buried layer 103 and the n-well 104 jointly represents a collector region of the bipolar transistor 100.

The semiconductor device region is delimited by isolation means 105 stretching from the surface 106 of the substrate down under the buried layer 103 into the initially doped substrate. A field oxide 107 covers the surface of the substrate having a first opening for a collector C and a second opening for an emitter E and a double base B. A highly doped region 108, of a doping of the second type n+, stretches from the surface of the first opening down to the buried layer 103, as is usual in this type of semiconductor device. The collector C is connected to the highly doped region 108 via a conductor 110 with a high conductivity, such as tungsten, a metal contact 111 and a doped polysilicon layer 125.

A thin region 109 is created at the surface in the second opening, having a doping of the first type p, representing a base region. Three separate regions 112, 113 are created at the surface of this region 109. A highly doped region with a doping of a second type n+ is created in the center, forming an emitter region 112. The emitter region is connected to a doped polysilicon layer 114, which in turn is connected to the emitter E via a metal contact 115 and a connector 116 with a high conductivity.

A base contact region 113 is created on each side of the emitter region 112, to which each base B is connected via a doped polysilicon layer 117, a metal contact 118 and a connector 119 with a high conductivity. The base contact regions 113 stretches down through the base region 109 and into the n-well 104.

The device is covered with an oxide 120 and a PSG (Phosphosilicate Glass) layer.

A trench is thereafter etched outside the semiconductor device region to form a plug 121, being a part of the electrical connection 101. The trench stretches from the PSG layer down to the initially doped substrate, where a plug contact region 122 is created with a high doping of the first type p++. The plug 121 is made of a material with a high conductivity, such as a metal, especially tungsten. The plug is connected, via a connector 123, to any part of the semiconductor device that needs to be grounded, in this case the emitter contact E.

In this way a connection is established from the emitter contact E to a reverse side 124 of the substrate 102, which may be grounded, via the connector 123 and the electrical connection 101, comprising a plug 121 and a plug contact region 122. If a high current is to be led through the established connection, the electrical connection may comprise a plurality of plugs.

FIGS. 2a–2e illustrates the manufacturing steps for the semiconductor device including the electrical connection in FIG. .1. The figures mainly shows the region where the semiconductor device, in this example a bipolar transistor, is created between the isolation means 105, the plug 121 is located outside this region.

Figure 2A:
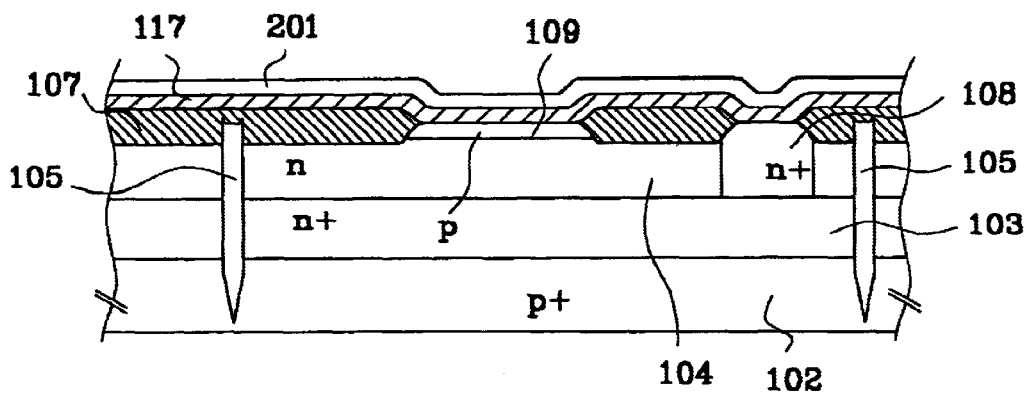
FIGS. 2a–2e shows manufacturing steps for the semiconductor device and the electrical connection in FIG. 1.

FIG. 2a shows a substrate 102 (p+ type) that has been processed up to a point where the following parts of the process is completed: growing a fist epitaxial layer to form a buried layer 103 (n+ type), growing a second epitaxial layer to form a n-well 104 (n type), introducing isolation means 105, deposition of field oxide 107 with a first and a second opening, creating a highly doped region (n+ type) stretching from the surface 106 of the first opening down to the buried layer 103, creating a base region 109 (p type) at the surface of the second opening, deposition of a polysilicon layer 117 with a high doping of the first type p+ and deposition of a first oxide layer 201 on the polysilicon layer 117. All these steps are performed in a way that are obvious for a person skilled in the art.

Figure 2B:
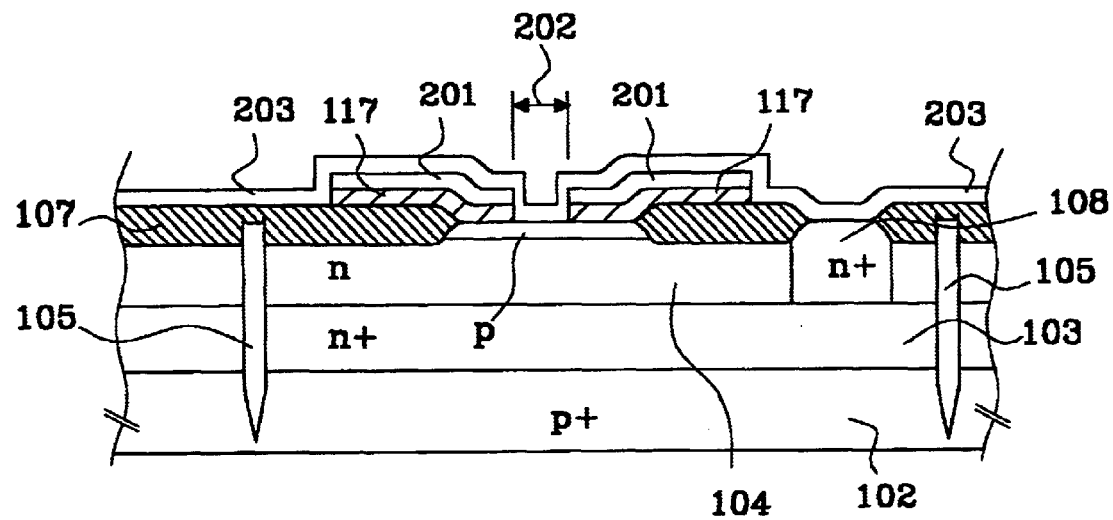

FIG. 2b shows a cross section of a semiconductor device where an emitter opening 202 and a collector opening are formed in the first oxide layer 201 and the polysilicon layer 117 down to the base region 109. A second oxide layer 203 is then deposited on top of the semiconductor device.

Figure 2C:
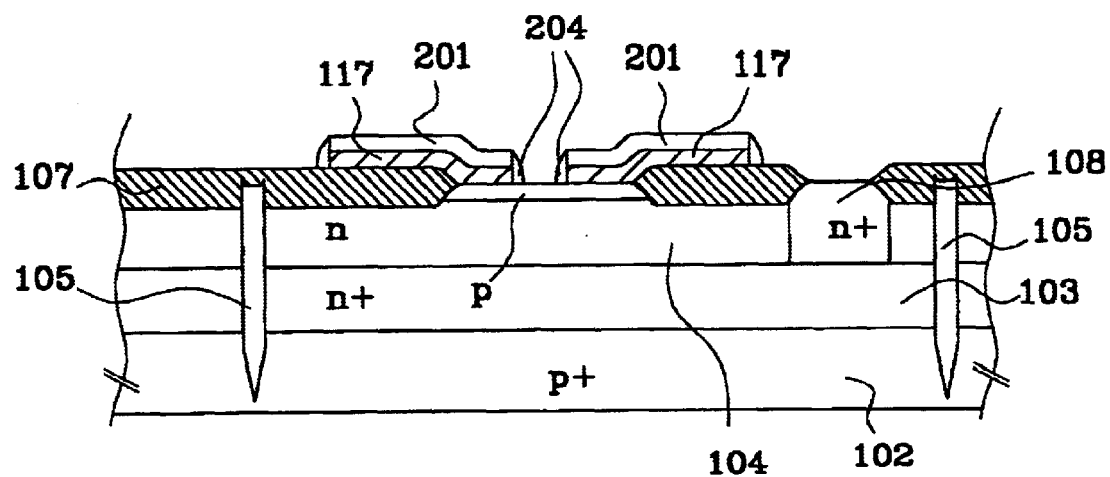
Figure 2D:
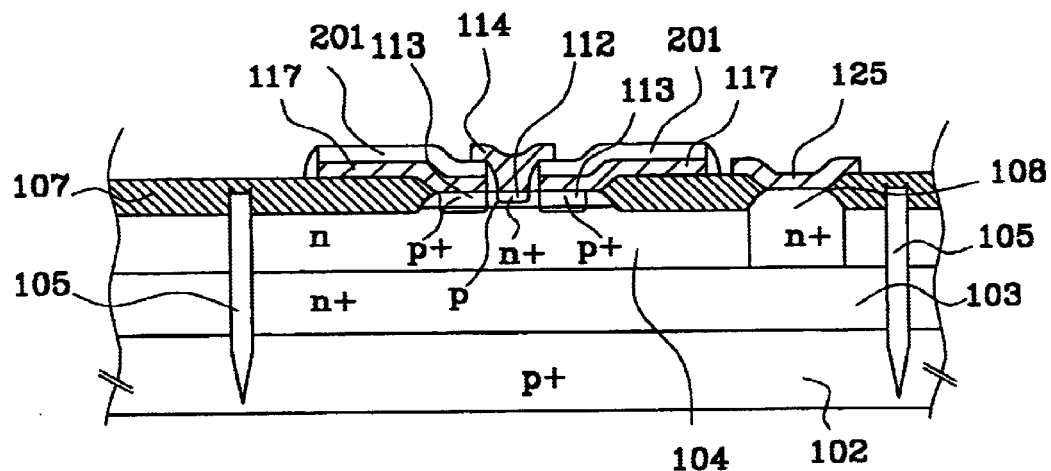

FIG. 2c shows a cross section of a semiconductor device where the second oxide layer 203 has been etched away leaving only two spacers 204, narrowing the emitter opening. A second polysilicon layer with a high doping of the second type n+ is deposited over the device and, as shown in FIG. 2d, etched to form a polysilicon layer 114 over the emitter opening 202 and a polysilicon layer 125 over the first opening, that is the collector opening. The substrate is subject to an anneal which drives in three regions 112, 113 into the base region 109. The emitter region 112 is formed directly beneath the polysilicon layer in the emitter opening 202 and a base contact region 113 is formed on each side of the emitter region 112 beneath the first polysilicon layer 117, where said base contact regions 113 stretches down through the base region 109 into the n-well 104.

Figure 2E:
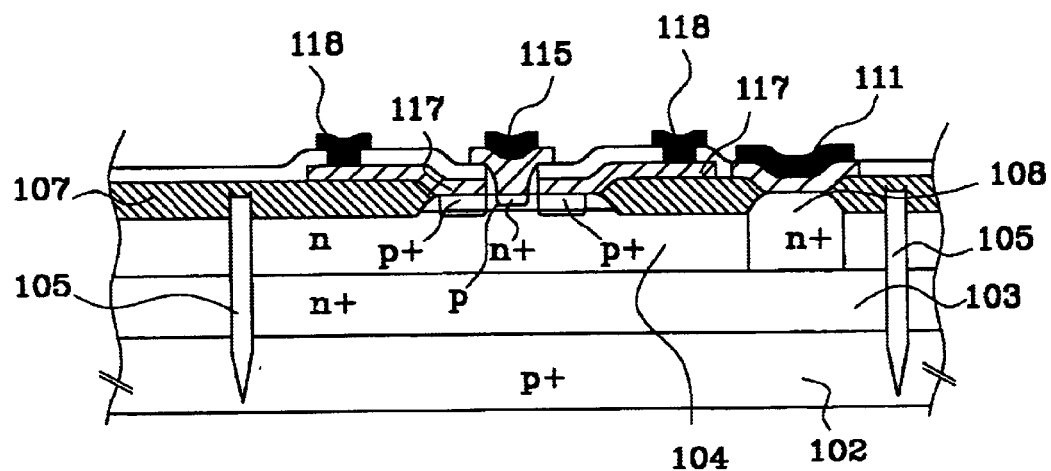

FIG. 2e shows a cross section where metal contacts 111, 115, 118 are created to establish electrical contact to the bipolar transistor 100. This process is well establish and known to a person skilled in the art.

The resulting semiconductor device 100, including the connection from the emitter connection E to the reverse side of the substrate 124, is illustrated and described in FIG. 1.

Figure 4:
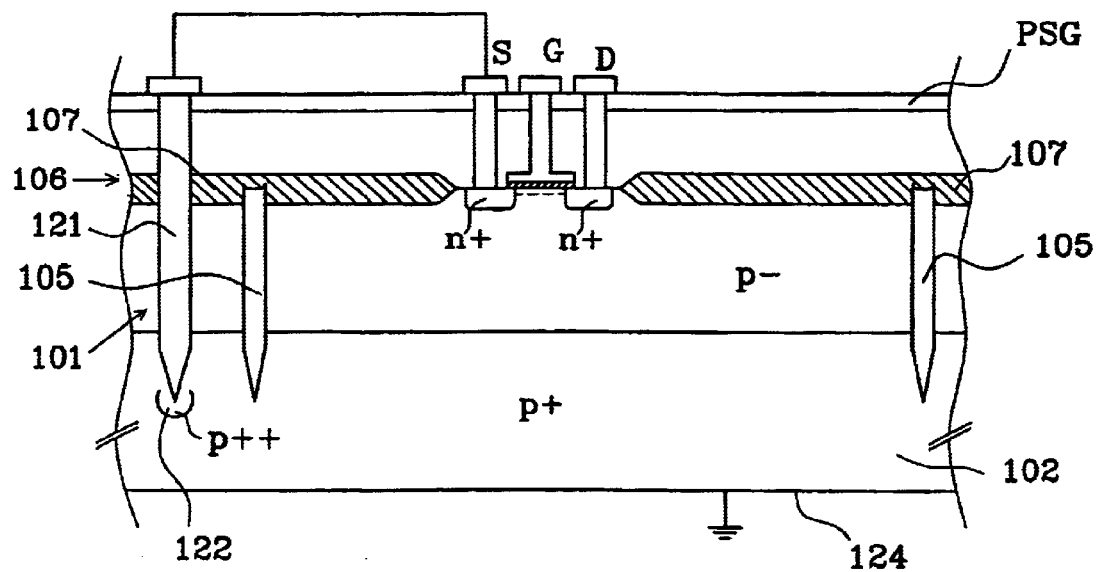
FIG. 4 shows a partial cross section of a semiconductor circuit, comprising a double MOS-transistor with a ground connection according to the present invention.

FIGS. 1 and 2a–2e only described a NPN bipolar transistor. It will be understood by one of ordinary skill in the art that other types of semiconductor devices, such as PNP bipolar transistors, MOS transistors or discrete components, may be implemented having a ground connection being connected to the reverse side of the substrate as shown in FIG. 1. For example, a MOS transistor according to the invention is illustrated in FIG. 4 having the ground plug connected to the source terminal. The semiconductor device may of course be part of a semiconductor circuit, which may consist of a plurality of different semiconductor devices. A major advantage is that a more compact layout of the semiconductor circuit may be obtained, with a reduced number of contact pads.

Figure 3:
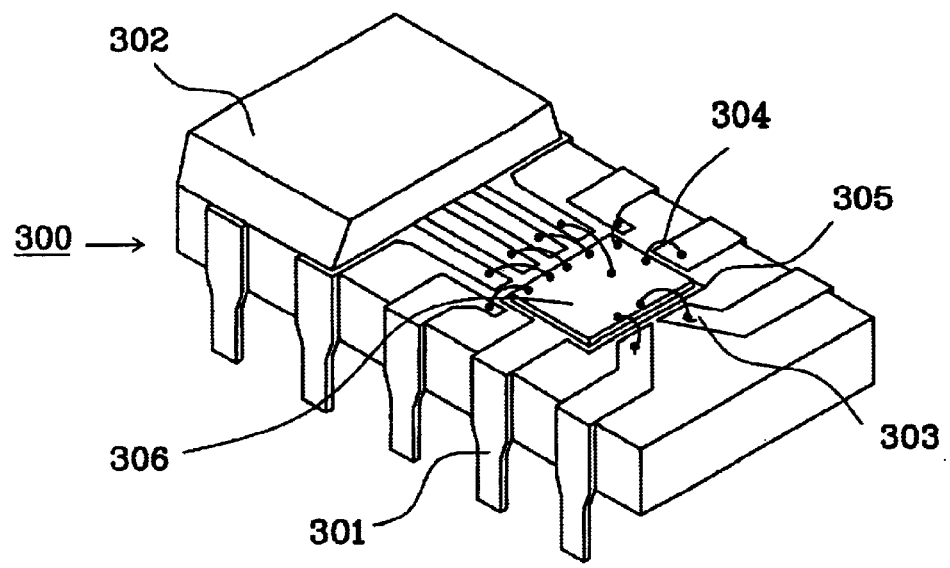
FIG. 3 shows a perspective view of an integrated circuit mounted in a package with a semiconductor circuit having a ground connection connected to a ground pin according to the invention.

FIG. 3 shows a perspective view of an integrated circuit 300 comprising a package 302, including pins and contact pads 303, bonding wires 304 and an semiconductor circuit 306, comprising at least one semiconductor device 100 with a ground connection E connected to a ground pin 301 according to the invention.

Each pin, except the ground pin 301, is connected to at least one pad on the semiconductor circuit 306 via the contact pads 303 and the bonding wires 304, respectively. The ground pin 301 is preferably directly connected to a lead frame 305 on which the reverse side 124 of the semiconductor circuit 306 is electrically attached.

A prior art integrated circuit has normally a large number of bonding wires to establish a ground connection from the integrated circuit to the package. The time for making all the connections is dependent on the number of bonding wires to attach. By reducing the number of bonding pads needed, and making the ground connection according to the invention, the procedure for attaching the bonding wires to the bonding pads on the circuit is significantly speeded up due to less bonding wires to attach.

Other ways of electrically connecting the reverse side of the semiconductor circuit may be used, such as connecting the lead frame via at least one separate bonding wire.

What is claimed is:

1. An arrangement for connecting a ground connection of a semiconductor device on top of at least one layer on one side of a semiconductor substrate to ground on the reverse side of the substrate, wherein a metal plug extends through said at least one layer down into the substrate, an isolation means extends through said at least one layer down into the substrate and is arranged between the semiconductor device and the metal plug for delimiting the semiconductor device, and an electrically conductive connector interconnects the ground connection and the metal plug.

2. The arrangement according to claim 1, wherein said plug extends deeper into the substrate then PN junctions located therein.

3. The arrangement according to claim 1, wherein the connector is a metal connector.

4. The arrangement according to claim 1, wherein said semiconductor device is a high frequency device.

5. The arrangement according to claim 1, wherein said semiconductor device is a power device.

6. The arrangement according to claim 1, wherein said semiconductor device is a bipolar transistor and said ground connection is an emitter connection.

7. The arrangement according to claim 1, wherein said device is a MOS transistor and said ground connection is a source connection.

8. The arrangement according to claim 1, wherein said isolation means is comprised of an oxide.

9. The arrangement according to claim 1, wherein said metal plug is comprised of an etched hole filled in its entirety with metallic material.

10. The arrangement according to claim 1, comprising a highly-doped plug contact region in said substrate at a lower tip of said metal plug.

11. The arrangement according to claim 10 wherein said substrate is doped with a first doping type and said plug contact region is a doped region of said substrate, said doped region being doped with the first doping type and having a higher doping concentration than that of said substrate outside said doped region.

12. The arrangement according to claim 1, comprising a plurality of metal plugs connected to said electrically conductive connector.

* * * * *